United States Patent [19]

Eulenberg et al.

[11] Patent Number: 4,593,241
[45] Date of Patent: Jun. 3, 1986

[54] HALL GENERATOR CIRCUIT WITH TEMPERATURE COMPENSATION

[75] Inventors: Hannspeter Eulenberg, Aachen, Fed. Rep. of Germany; Horst Larue, Kerkrade, Netherlands

[73] Assignee: Kernforschungsanlage Julich GmbH, Julich, Fed. Rep. of Germany

[21] Appl. No.: 623,424

[22] Filed: Jun. 22, 1984

[30] Foreign Application Priority Data

Jun. 25, 1983 [DE] Fed. Rep. of Germany ....... 3322942

[51] Int. Cl.⁴ ............................................ G01R 33/06
[52] U.S. Cl. .................................... 323/294; 307/309; 323/368
[58] Field of Search ....................... 323/294, 368, 907; 324/257, 117 H; 307/309

[56] References Cited

U.S. PATENT DOCUMENTS

| | | | |
|---|---|---|---|
| 4,371,837 | 2/1983 | Sieverin | 307/309 |
| 4,449,081 | 5/1984 | Doemen | 324/257 |
| 4,521,727 | 6/1985 | Atherton et al. | 323/368 |

FOREIGN PATENT DOCUMENTS

| | | | |
|---|---|---|---|
| 0052981 | 6/1982 | European Pat. Off. | 307/309 |
| 2640082 | 3/1978 | Fed. Rep. of Germany | 307/309 |

OTHER PUBLICATIONS

Bolash et al., "Monolithic Hall Cell System," IBM Tech. Discl. Bul., vol. 21, No. 7, pp. 2717, 18, Dec. 1978.
Siemens—Datenbuch 1976/77—Magnetfeld-abhangige Halbleiter.

Primary Examiner—William H. Beha, Jr.
Attorney, Agent, or Firm—Karl F. Ross; Herbert Dubno

[57] ABSTRACT

A temperature compensating circuit for a Hall generator with a positive temperature coefficient of the resistance of the drive circuit path utilizes summation of a voltage representing the drive current as detected across a substantially temperature-independent compensating resistance in the drive current path, with a constant voltage component to provide one output to an operational amplifier whose other output is connected to this operational amplifier which produces the output signal of the circuit.

10 Claims, 6 Drawing Figures

HALL GENERATOR CIRCUIT WITH TEMPERATURE COMPENSATION

FIELD OF THE INVENTION

Our present invention relates to a Hall generator circuit using a Hall generator with a positive temperature coefficient (TK) of the resistance of the drive current path, e.g. InAs-probes and with temperature compensation and, more particularly, to a system for enabling temperature compensation of a Hall generator output representing a measurement of magnetic induction.

BACKGROUND OF THE INVENTION

The use of Hall generators for the measurement of magnetic induction has found increasing importance in recent years. They may be utilized for the measurements of magnetic fields, e.g. in high energy particle accelerators, whereever magnetic fields are generated for control or instrumentation purposes and even for feedback control of magnetic fields. Hall generators, as is known, have a drive-current path and, at right angles thereto, an output-voltage path across which the Hall voltage is generated. A magnetic field is applied perpendicularly to both of these paths.

Because of the negative-temperature coefficient of the Hall voltage, a Hall generator, unless provided with a temperature-compensation circuit, will shown an undesired temperature drift. In the SIEMENS databook 1976/77 *Magnetfeldabhangige Halbleiter* (Magnet Field Dependent Semiconductors), a circuit for compensation purposes is disclosed.

In this circuit the compensation for the temperature drift of the Hall voltage is effected in a bridge circuit in which the Hall generator forms an arm of the bridge. Apart from the well known disadvantages of such bridge circuits with the coupling-in of the voltage generated by the drive current and the tuning out of the signal voltage (Hall voltage), this temperature-compensation circuit has the disadvantage that it is unable to suppress other temperature- and amplitude-dependent perturbations, noise or interference polarities.

OBJECTS OF THE INVENTION

It is, therefore, the principal object of the present invention to provide a temperature-compensating circuit for a Hall generator with a positive temperature coefficient (TX) of the resistance of the drive current path whereby the disadvantages of earlier bridge circuits for this purpose are obviated.

Another object of this invention is to provide a Hall-generator circuit with temperature compensation which not only can compensate for the temperature drift of the Hall voltage but also can provide compensation for interference voltages superimpose upon the Hall voltage.

SUMMARY OF THE INVENTION

We have found it is possible to obviate the disadvantages of the aforedescribed earlier system by eliminating the bridge circuit entirely if the temperature compensation is effected through the use of differential amplifier means responsive to the current flow along the drive-current path and, more particularly, to a voltage representing this drive-current as detected across a substantially temperature-independent compensating resistance, preferably an adjustable temperature-independent compensating resistance in series with the drive-current path of the Hall generator and the output of this differential amplifier means forms the temperature-dependent control voltage which is added to a constant-voltage component in a summing circuit which, in turn, feeds an operational amplifier whose inverting input is connected to one of the output terminals of the Hall generator while the output of this operational amplifier is connected to one of the terminals of the drive-current path. With this circuit, which can be enhanced with additional circuit elements for providing temperature compensation for other temperature-dependent voltage in the system, we have found that it is possible to correct completely for the temperature-drift tendency described previously, without any of the significant disadvantages of bridge-compensating circuitry.

More particularly, the temperature-compensating circuitry of the invention operates with a Hall generator having a drive-current path which is connected in series with substantially temperature-independent compensating resistance, and an operational amplifier having its inverting input connected to one of the signal-voltage terminals of the Hall generator and its output connected to the output terminal of the drive current path of the Hall generator, and a noninverting input connected nondissipatively to a direct- or alternating-current voltage against ground which derives from the output, in turn, of the summing amplifier means.

The summing amplifier means can include an operational amplifier which receives as inputs a reference or control voltage of a constant level and the temperature-dependent output of the differential-amplifier means previously described. The summation or control voltage thereof applied to the noninverting input of the first operational amplifier, therefore, thus compensates for the temperature-dependent drop in the Hall voltage. The differential amplifier can also be a circuit element utilizing operational amplifier technology. The operaional amplifier of the differential amplifier means has its noninverting input connected between the junction of the temperature-independent resistance and the other terminal of the drive-current path, i.e. the input-side terminal of the drive-current path of the Hall generator while the inverting input is connected with the output side terminal of the drive-current path, the differential amplifier being so configured or provided with a circuit network such that the temperature-dependen output voltage thereof can be set to zero at a given reference temperature.

When the Hall generator is then used as a sensor for measuring a magnetic field, the circuit of the invention, as outlined in general terms above, can be used to provide a high precisio in the measurements of relatively small magnetic fields free from the temperature drift of the Hall generator.

The voltage which is coupled-in should have an alternation frequency which is higher than the frequency of an alternating magnetic field if one is to be measured, thereby ensuring frequency-selective measurments via the Hall voltage . In this case, the circuit of the invention can be used without a compensation of the ohmic zero-voltage.

More commonly, however, we may wish to suppress voltage generated by the voltage coupled into the drive-current and observable between ground and the second signal-voltage contact of the Hall generator or field detector.

In this case, a further differential amplifer means is provided which has one input connected to this second signal-voltage contact of the Hall generator and its other input connected to the ouput-side terminal of the drive-current path and selectively with the output of the first mentioned operational amplifier or with the noninverting input thereof. The ouput voltage of this additional differential amplifier thus provides a temperature-compensated Hall voltage over ground. Since the coupled-in voltage is brought to ground level, highly precise measurements of the induction of small magnetic fields can be made utilizing a Hall generator excited with direct current and having as a measurement result the Hall voltage.

The development of so-called ohmic residual or zero voltage cannot be avoided. This zero-voltage is, unless specifically compensated for, superimposed on the Hall voltage and thus upon the voltage delivered by the output of the latter differential amplifier.

According to a further feature of the invention, the circuit, which is provided with the differential amplifier to suppress the coupled-in voltage, will further comprise a network for compensating the residual or zero voltage of the Hall generator.

This network comprises an adjustable, practically temperature-independent, resistor which is connected between the output-side terminal of the drive-current path of the Hall generator and the output of the first mentioned operational amplifier. The second input of the differential amplifier is connected with the output of this operational amplifier.

The adjustable resistance does not influence the amplitude of the drive-current. It serves, however, to adjust the amplitude of a temperature-dependent voltage which is fed from the output of the operational amplifier to the second input of the differential amplifier. With corresponding dimensioning of the adjustable resistance at the predetermined reference temperature, the ohmic residual or zero voltage can be suppressed.

The compensation of the tempreature-dependent part of the residual or zero voltage is effected by a corresponding setting of the differential amplifier. To this end, the differential amplifier is formed as an operational amplifier provided with a trimmer resistor, the noninverting input of this second operational amplifier being connected with the second signal-voltage terminal of the Hall generator while the inverting input is connected with the wiper of the trimmer and one of the two other terminals of the trimmer is connected with the output of the second operational amplifier whereas the remaining terminal of the trimmer is connected with the output of the first operational amplifier.

Upon setting of the trimmer in accordance with the characteristics of the Hall generator, the effect of temperature changes on the residual voltage can be greatly reduced or eliminated.

Between the input-side terminal of the drive-current path of the Hall generator and the signal-voltage terminal connected to the first operational amplifier, a portion of the Hall voltage generated by the magnetic field can be detected. With symmetrically configured Hall generators, this portion of the Hall voltage is half. This portion of the Hall voltage generates a drive-current component which is not only influenced by the temperature in the Hall generator but also by the magnetic field to be measured.

To eliminate this detrimental effect and the associated inverting effect of the Hall generator, one of the inputs of the summing means is connected with the output of the circuit while another input is connected to the coupled-in voltage. The summing member of the circuit thus coupled-in a portion of the output of the circuit counterphasally to the Hall voltage to compensate for deviations in the linear-characteristic of the Hall generator response.

For stabilization of the circuit with respect to external temperature fluctuations, it has been found to be highly advantageous to thermally couple the compensating resistance and the resistance between the output side drive-current terminal of the Hall generator and the output of the operational amplifier, to thermally couple the resistance ahead of the trimmer, and to thermally couple in addition the conductor leading to the input-side terminal of the drive-current path of the Hall generator, the thermal coupling in these cases being, for example, the mounting of these elements so that they are all at the same temperature, e.g. by providing them in contact with or against a common heat sink.

The circuit according to the invention permits hall generators of the type described to be used for highly precise measurements with significant sensitivity.

BRIEF DESCRIPTION OF THE DRAWING

The above and other objects, features and advantages of the present invention will become more readily apparent from the following description, reference being made to the accompanying drawing in which.

SPECIFIC DESCRIPTION

Figure 1:
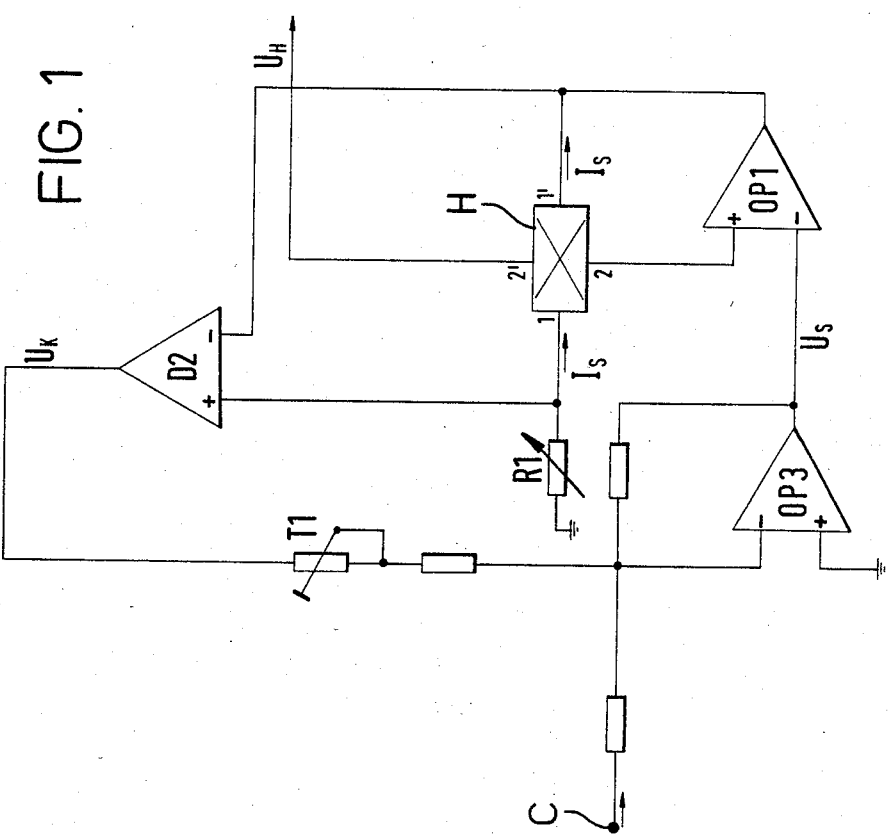
FIG. 1 is a circuit diagram of a circuit according to the invention for a Hall generator with compensation of the temperature-dependent portion of the Hall voltage.

FIG. 1 shows a circuit diagram of a circuit according to the invention utilizing a Hall generator H whose drive-current path I—I' is provided with an adjustable compensating resistance RI serving as a preresistance, and an operational amplifier OP1 whose inverting input is connected to the signal-voltage terminal 2 of the Hall generator while its output is connected to the output terminal 1' of the drive-current path.

To the noninverting input of the operational amplifier OP1 a direct of alternating current potential $U_s$ or $u_s$ above ground is applied in a nondissipstive mannner. This voltage is supplied by a constant, temperature-independent circuit network and a circuit network whose voltage changes with the temperature of the electrical system of the Hall generator.

The temperature-dependent circuit network is provided with a trimmer resistor II which allows adjustment of the output of this network, the output voltage of which has been represented at $U_k$ and which can include a differential amplifier D2.

Figure 2:
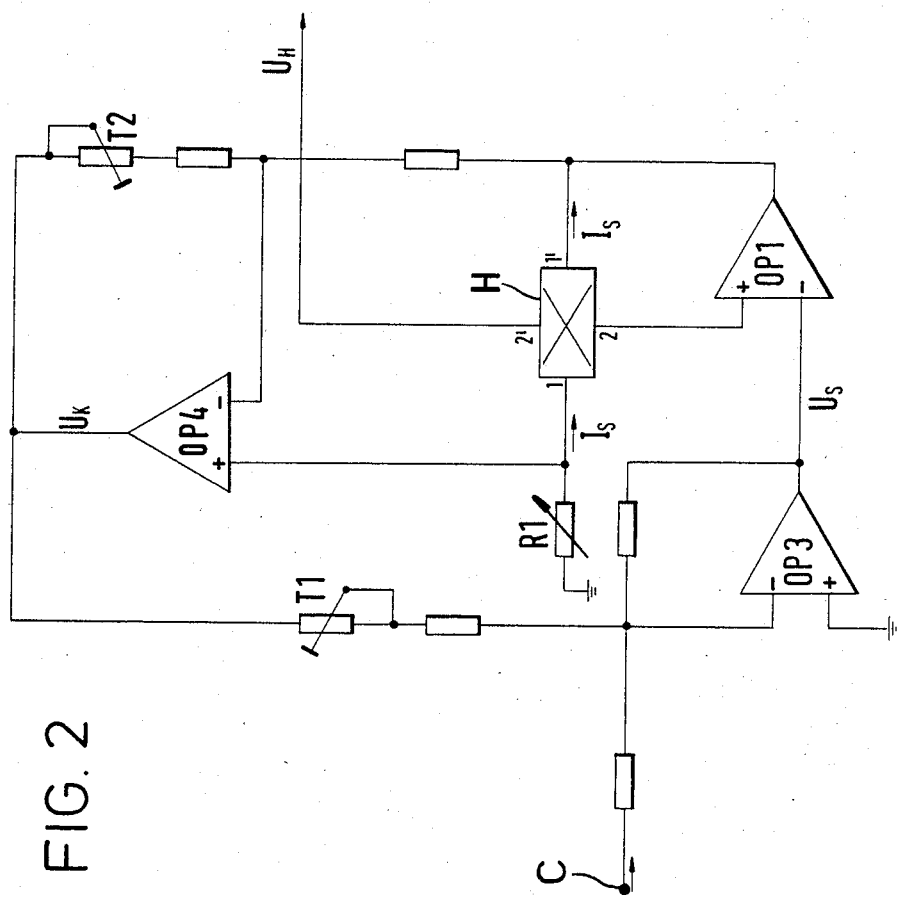
FIG. 2 is a circuit diagram of a circuit similar to that of FIG. 1 but utilizing a differential amplifier in the form of an operational amplifier.

In FIG. 2 we have shown an operation amplifier OP4 which performs this role in accordance with operational amplifier techniques. The noninvertive input of the differential amplifier is connected to the input-side terminal of the Hall generator H while the inverting input of the differential amplifier D2 is connected with the output-side terminal 1' of the Hall generator.

The constant voltage component, which is added to the temperature-dependent voltage component $U_k$ at the operation amplifier OP3 forming a summing amplifier, cna be delivered to the constant voltage terminal G.

Consequently, with a temperature-dependent drop in the Hall voltage as detected by the differential amplifier D2, a compensating voltage is generated which is combined with the constant voltage in the operational amplifier OP3 and the control current is automatically adjusted, i.e. the output of the operational amplifier OP3 is utilized to correct the temperature-dependent drop in the Hall voltage.

In the embodiment of FIG. 2, in place of the differential amplifier D2, an operational amplifier OP4 serves to detect the change in the Hall voltage with temperature to provide the control value $U_k$ which is utilized to feed the summing amplifier OP3 and provide the signal $U_S$ which is utilized to adjust excitation signals to the Hall generator.

Another trimmer resistor T2 allows zero compensation for the value $U_k$ at a particular reference temperature.

Figure 3:
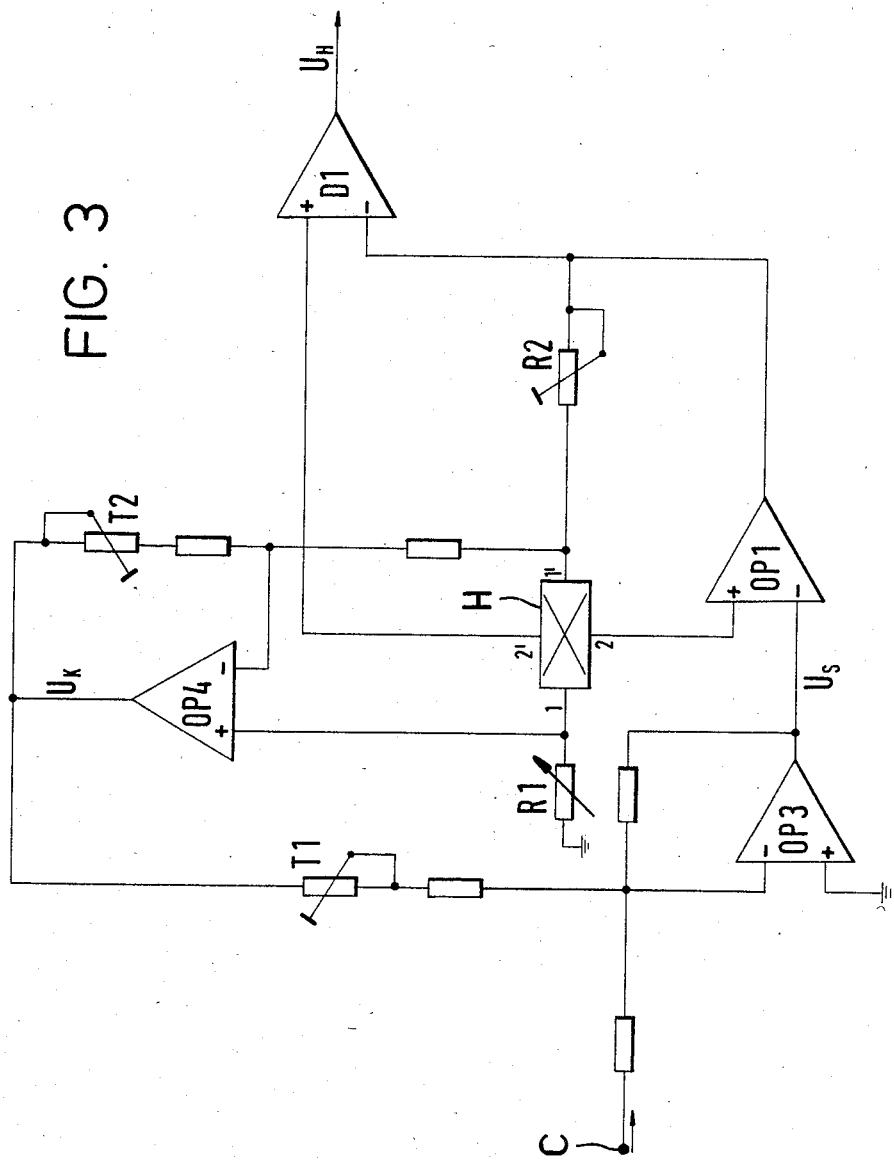
FIG. 3 a circuit similar to FIG. 2 which includes circuit elements for the suppression of the coupled-in voltage $u_S$ or $U_S$.

FIG. 3 shows an embodiment of the invention which is generally similer to the embodiment of FIG. 2 but wherein a further differential amplifier D1 is provided. The differential amplifier D1 serves to suppress the coupled-in value of the voltage $U_s$ to the Hall voltage $U_H$. One input of the differential amplifier D1 is therefore connected to the output of the operational amplifier OP1 wherein the other input is connected to the chosen voltage output terminal 2' of the Hall generator H while the output of the differential amplifier is here the compensated value $U_H$.

The circuit of FIG. 3 additionally includes an adjustable resistor R2 between the output-side drive-current terminal I' of the Hall generator and the output of the operational amplifi OP1.

One of the two inputs of the differential amplifier D1 is therefore connected between the end of the variable resistor R2 opposite that connected to the terminal I' and the output of the operational amplifier OP1.

With corresponding adjustment of the variable resistor R2, the differential amplifier DI is supplied with a voltage which suppresses the output voltage of the differential amplifier D1 in the absence of a magnetic field at the Hall generator. By a corresponding adjustment of the difference to the differential amplifier DI, we are able to compensate for the temperature-dependent component of the residual or zero voltage.

Figure 4:
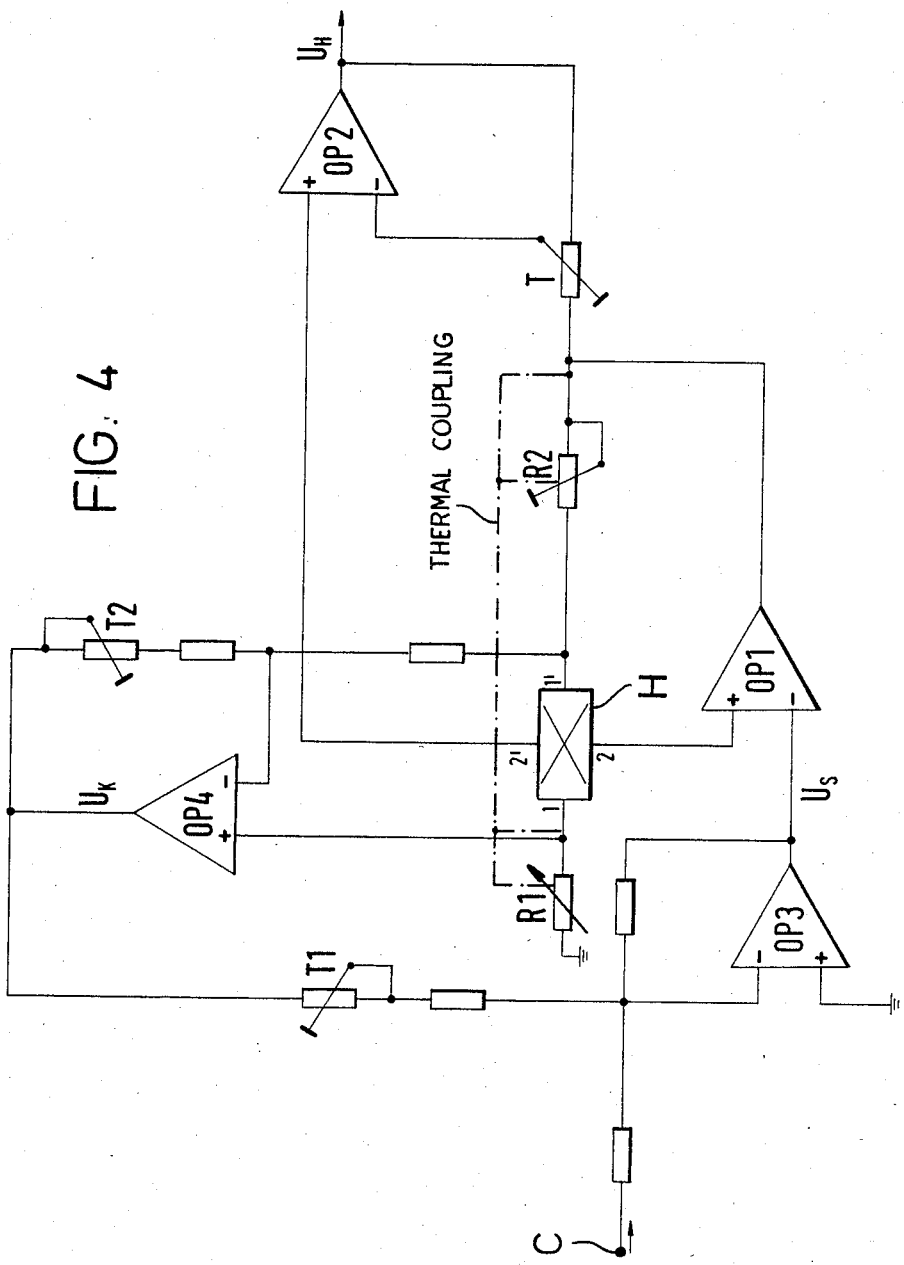
FIG. 4 still another circuti diagram of a circuit containing a Hall generator and generally similer to FIG. 2 with circuit elements for suppressing the residual or zero voltage and for compensating the temperature-dependent portion of the residual or zero voltage.

FIG. 4 shows a preferred embodiment of the invention which extends the principles of the circuit of FIG. 3. In this embodiment, in place of the differential amplifier D1, an operational amplifier with a respective trimmer T can be used in accordance with operational amplifier techniques. The operation amplifier OP2 and its trimmer T can be utilized after a corresponding setting of the variable resistor R2 to compensate for the temperature-dependent portion of the residual or zero voltage.

Figure 5:
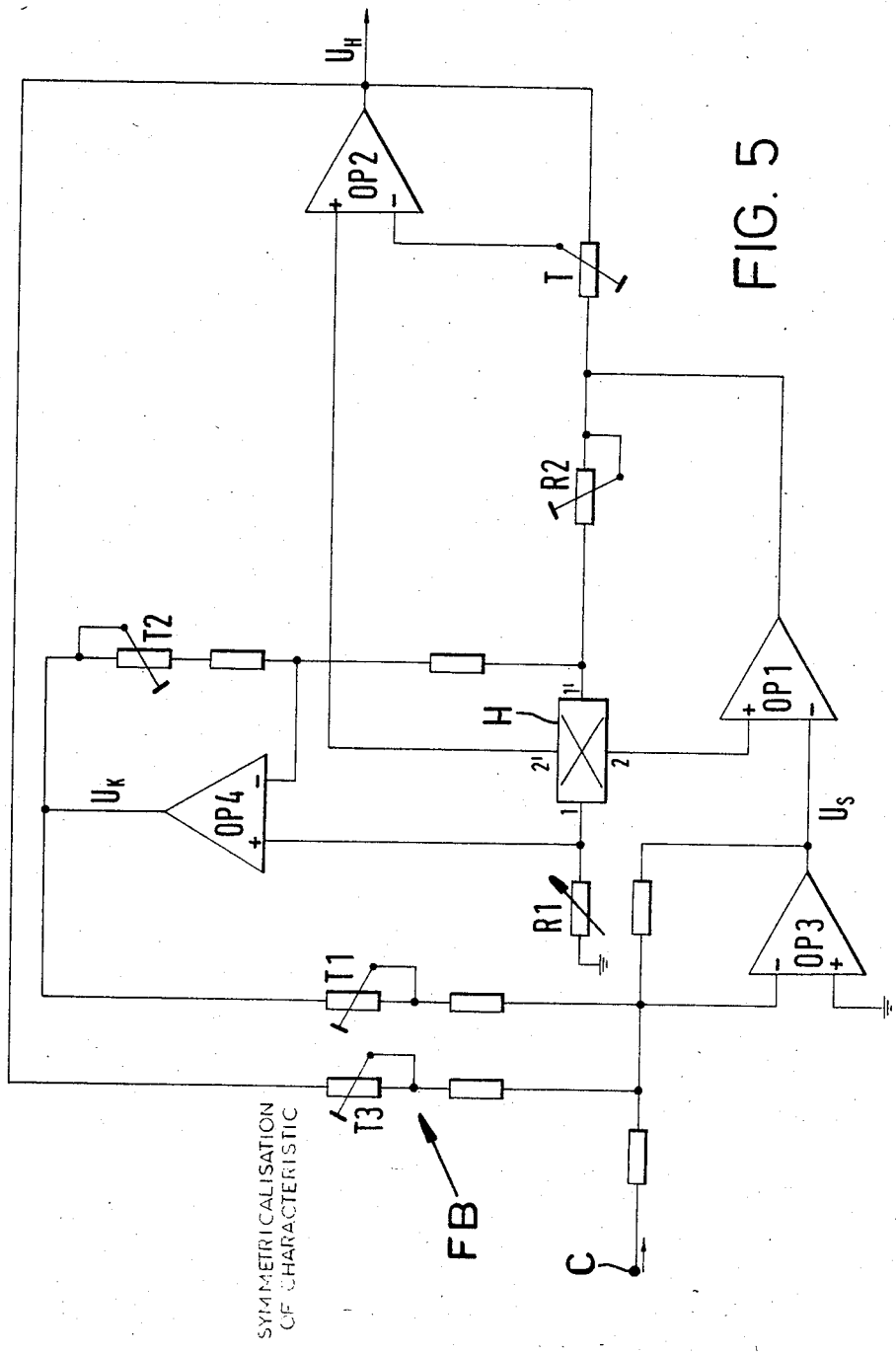
FIG. 5 is a circuit similar to FIG. 4 which, however, utilizes a differential amplifier in the operational amplifier mode and including circuit elements for symmetricalization of the characteristics of the Hall generator.

The arrangement of FIG. 5 includes an additional circuit element to compensate for the nonlinearities of the measuring voltage resulting from the reversal effect and, especially, serves to render symmetrical the characteristic of the Hall generator (Hall voltage as a function of magnetic induction). In this case, a portion of the voltage $U_H$ is coupled in a counterphase to the Hall voltage. This counterphase feedback circuit is represented at FB and includes a trimmer T3 which allows adjustment of this negative feedback loop to the summing amplifier OP3.

Figure 6:
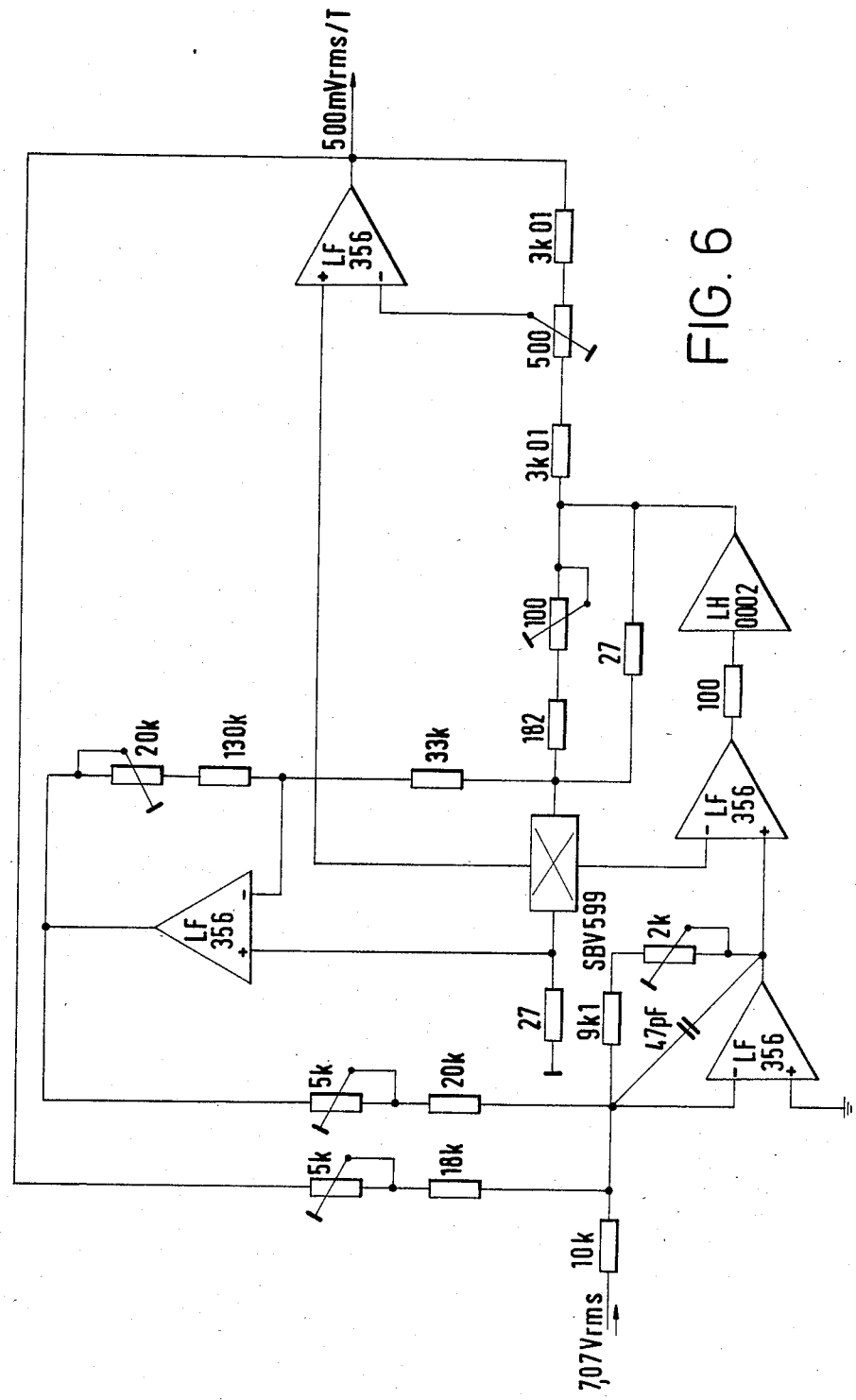
FIG. 6 is circuit diagram including values for the various circuit elemens as a specific examples of the embodiment of FIG. 5.

In FIG. 6 we have shown specific examples for the various circuit elements, the operational amplifiers OP1, OP2, OP3 and OP4, all being preferably of the LF 356 type while in this circuit the inverter LH 0002 amplifier is connected between the output of the operational amplifier OP1 and the junction between the resistor R2 and the trimmer T. The trimmers T1 and T3 are 5 kΩ in series respectively with 20 and 18 kΩ while the trimmers T and T2 are 500Ω and 20 kΩ resistors in series respectively with 3 kΩ and 130 kΩ resistors respectively. A 33Ω resistor is connect between terminals I' of the Hall generator H and the noninverting input of operational amplifier OP4. The Hall generator can be of the type SBV 599 manufactured by SIEMENS and the other resistance values and their tolerances in percent where significant have likewise been given.

We claim:

1. A Hall generator circuit using a Hall generator with a positive temperature coefficient (TK) of the resistance of the drive current path with temperature compensation which comprises:

a Hall generator having a drive-current path having a drive-current input terminal, a drive-current output terminal, and a signal voltage path having a pair of signal voltage terminals;

a substantially temperature-independent resistox (R1) connected in series with said drive-current path and to said drive-current input terminal;

differential amplifier means having inputs connected respectively to said drive-current input terminal and said drive-current output terminal, and an output at which a temperature-compensating voltage appears;

summing amplifier means for summing said control voltage and at least one other voltage in the form of a constant voltage and producing an output voltage; and an operational amplifier having inputs connected respectively to the output of said summing amplifier means and to one of said signal-voltage terminals of said Hall generator, and an output connected to the drive-current output terminal for compensating for temperature drift of said Hall generator of a Hall voltage detected at the other signal voltage terminal.

2. The circuit defined in claim 1 wherein said operational amplifier (OP1) has its inverting input connected with said one of said signal-voltage terminals (2) of said Hall generator (H) and its noninverting input supplied by a direct or alternating current ($U_S$ or $u_S$) voltage nondissipatively coupled thereto from said summing amplifier means, said differential amplifier means having a noninverting input connected to the drive-current input terminal (1) and the inverting input connected to the drive-current output terminal (1'), the differential amplifier means being settable so that its temperature-dependent output voltage ($U_k$) is zero at a predetermined reference temperature.

3. The circuit defined in claim 2 wherein, to suppress the voltage ($U_S$ or $u_S$) which is coupled-in to the generation of the drive-current ($i_S$ or $I_S$) of the Hall generator between ground and said other signal-voltage contact terminal (2') of the Hall generator and adjustable difference-forming differential amplifier (D1) is provided and has one input connected with said other signal-voltage terminal (2') of said Hall generator, a second input connected with the drive-current output terminal (1') of the Hall generator and selectively with the output of said operational amplifier (OP1) or with its noninverting input, whereby the output voltage of said differential amplifier (D1) corresponds to the temperature-compensated Hall voltage ($u_E$ of $U_E$).

4. The circuit defined in claim 3 wherein, for compensation of the ohmic residual or zero voltage of the Hall generator a substantially temperature-independent adjustable trimmer resistor (R2) is connected between the drive-current output terminal (I') of the Hall generator and the output of the operational amplifier (OP1), the second input of the differential amplifier (D1) being connected with the output of the operational amplifier (OP1).

5. The circuit defined in claim 3 wherein said differential amplifer is a second operational amplifier (OP2) having a trimmer (T), a noninverting input of sid second operational amplifier (OP2) being connected with said other signal-voltage terminal (2), an inverting input of said second operational amplifier (OP2) being connected to the wiper of the trimmer (T), one other terminal of said trimmer being connected with the output of the second operational amplifier (OP2) and a further terminal of said trimmer being connected with the output of the first operational amplifier (OP1).

6. The circuit defined in claim 1 further comprising means for compensating for the Hall-voltage component between the drive-current input terminal (I) and said one of said signal voltage terminal (2) and for the inverting effect of the Hall generator, said means including a connection between one of the inputs of said summing means with a Hall voltage output and means for applying the coupled-in voltage ($U_S$ or $u_S$) to the other terminal of said summing amplifier means.

7. The circuit defined in claim 5 wherein said substantially temperature-independent resistor (R1) and said adjustable trimmer resistor (R2) are thermally coupled.

8. The circuit defined in claim 7 wherein resistors which are connected in series with the trimmer (T) are thermally coupled.

9. The circuit defined in claim 7 wherein said drive-current path has a conductor connected to said drive-current input terminal which is thermally coupled with said substantially temperatue-independent resistor (R1).

10. The circuit defined in claim 5 wherein for symmetricalisation of the characteristic of the Hall generator said differential amplifier means includes an operational amplifier having a further trimmer (T3) in series with a resistor connected between the output of said further operational amplifier and an inverting input thereof.

* * * * *